United States Patent [19]

Bielak

[11] Patent Number: 5,420,722

[45] Date of Patent: May 30, 1995

[54] SELF-REGISTERING MICROLENS FOR LASER DIODES

[75] Inventor: Richard R. Bielak, Port Coquitlam, Canada

[73] Assignee: Creo Products Inc., Burnaby, Canada

[21] Appl. No.: 140,924

[22] Filed: Oct. 25, 1993

[51] Int. Cl.$^6$ ............................................. G02B 13/18
[52] U.S. Cl. ................................ 359/708; 359/642; 359/819
[58] Field of Search ............... 359/708, 709, 710, 711, 359/712, 718, 719, 642, 819

[56] References Cited

U.S. PATENT DOCUMENTS 5,329,406  7/1994  Nakanishi et al. .................. 359/642

Primary Examiner—Scott J. Sugarman

[57] ABSTRACT

A cylindrical microlens is mounted directly to a laser diode die by using reference edges touching the die at the emitting face and at the top face. Three edges are used to have a stable mounting. The cylindrical microlens, including the reference edges, is manufactured by drawing a glass preform, thus the edges are in perfect register with the optical center of the microlens.

4 Claims, 1 Drawing Sheet

SELF-REGISTERING MICROLENS FOR LASER DIODES

BACKGROUND OF THE INVENTION

The present invention relates to laser diode optics and more specifically to coupling the emission from a laser diode to small lenses, also know as microlenses.

Because of the large numerical aperture of laser diodes it is necessary to use lenses of a short focal length and therefore a small physical size. The use of such lenses poses special problems in keeping the lens accurately placed relative to the emission point of the laser diode. It is common to require alignment of better than one micron between the optical center of the lens and emission point of the diode. The problem is compounded on wide diodes, such as wide area emitters or multi-element laser diodes. The emission area of these diodes is elongated and sometimes deviates from a straight line due to distortion caused by mounting the diode on the heatsink. When the diode is bent the alignment problem is aggravated since the lens has to be bent to match the curvature of the diode in order to avoid magnifying the curvature due to the effect of the short focal length.

OBJECT AND SUMMARY OF THE INVENTION

The main object of the invention is to provide a self-registering lens that, when mounted on the laser diode die, requires no alignment. A further object is to manufacture the lens at a low cost. These and further objects can be achieved by incorporating reference surfaces in the lens which come into contact with the laser diode die in the vicinity of the emission point. When the lens is a cylindrical lens manufactured by drawing a preform (similar to the process used in the production of optical fibers) the reference surfaces form an integral part of the lens and have extraordinary accuracy and stability relative to the optical center of the lens. The process of manufacturing lenses by drawing a preform is detailed in U.S. Pat. Nos. 5,080,706 and 5,155,631. Since the preform is made much larger than the final lens, all the tolerances scale down when drawing the preform into a lens. Since the lens references directly near the emission point of the laser diode die, any errors in mounting of the die are eliminated. The lens is sufficiently flexible to follow the curvature of the die thus the magnification of curvature errors is eliminated.

BRIEF DESCRIPTION OF THE PREFERRED EMBODIMENT

DETAILED DESCRIPTION OF THE PREFERRED EMBODIMENT

Figure 1:
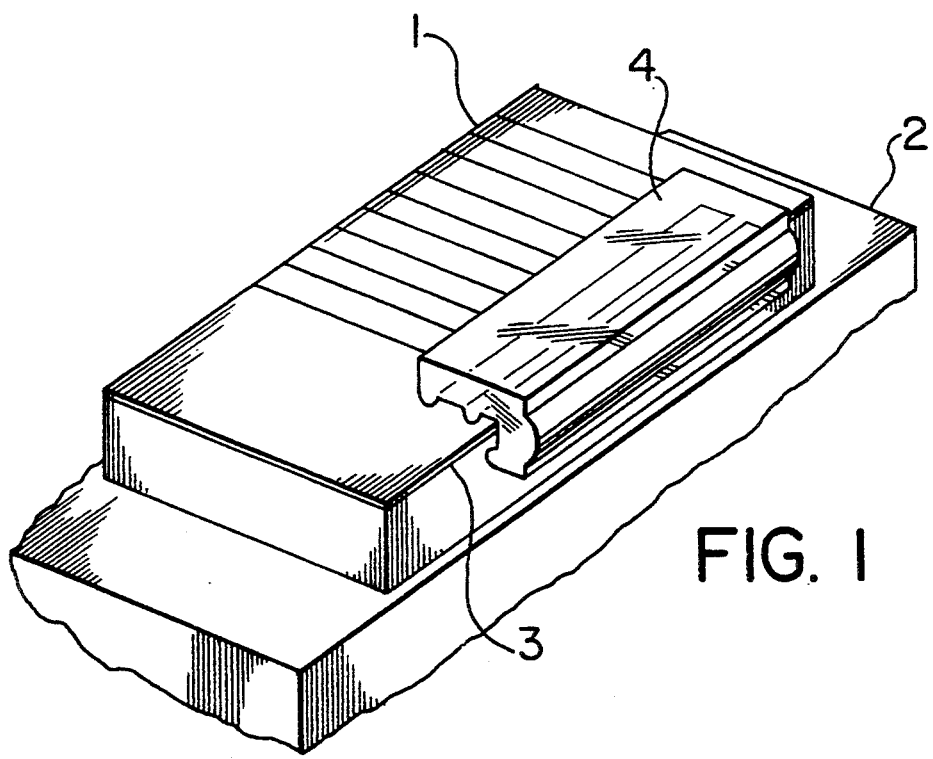
FIG. 1 is a perspective view of the microlens according to the present invention, when mounted on a laser diode die.
Figure 2:
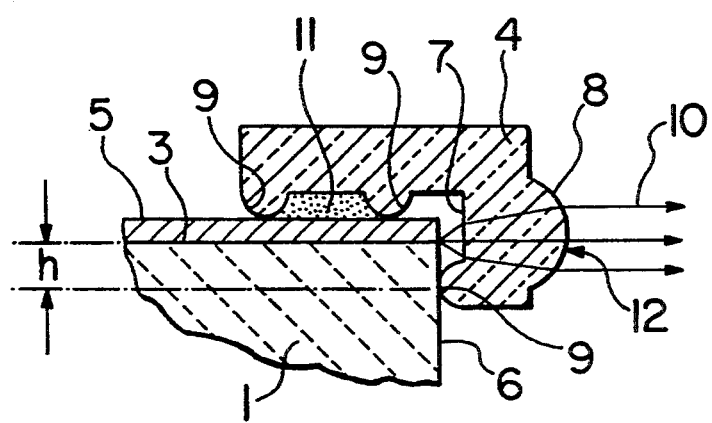
FIG. 2 is a cross section of the microlens according to the current invention, when mounted on a laser diode die.

Referring to FIG. 1 and FIG. 2, a glass cylindrical microlens 4 is mounted directly to a laser diode die 1. The die 1 is mounted on heat sink 2 and has a junction layer 3 emitting laser light 10 from the front edge of the die 6. Referring now to FIG. 2, the die 1 has a front edge 6 generated by cleaving and a top face 5 generated by covering the junction layer 3 by multiple layers deposited on the junction layer 3. The top face 5 is parallel to junction layer 3 with a high degree of accuracy since the overall thickness of the layers above the junction layer 3 is very small (about one micron). The front edge 6 is very flat but not always perpendicular to face 5 due to the nature of the cleaving operation. Microlens 4 contacts die 1 with reference edges 9. The use of three edges assures a stable non-rocking mount. Microlens 4 is permanently bonded to die 1 using an adhesive 11. Surfaces 7 and 8 of microlens 4 form a cylindrical lens. First and second surfaces 7 and 8, respectively, of microlens 4 form a cylindrical lens 12 collecting laser light 10 and shaping it into the desired degree of collimation. In order for lens 12 to be diffraction limited surface 8 is an aspheric cylindrical surface.

By the way of example, microlens 4 is manufactured by the process disclosed in U.S. Pat. Nos. 5,080,706 and 5,155,631. In this process a glass preform, between 10 to 100 times larger in cross-section than the finished microlens, is prepared by grinding. The preform is heated to its softening point and drawn to reduce its cross-section. At the same time all surface roughness and geometry errors are scaled down by the reduction ratio. By the way of example, a 25 mm wide preform ground to a tolerance of 5 microns can be drawn to a 0.5 mm wide microlens with a similar 50 fold reduction in tolerance, from 5 microns to 0.1 microns. Since the tolerances required to position a microlens relative to the emission point of a laser diode are below one micron, the tolerances achieved by this process are suitable.

Since the reference edges 9 are drawn at the same time as the optical surfaces 7 and 8 they self-register the lens 12 against the laser diode die 1. The vertical distance between the reference edge 9 touching the front facet of the die 1 and the emission point should be as small as possible to eliminate the focus error caused by non-perpendicular cleaving. For example, if the cleaving is 1° off from perpendicular and the distance h between the emission point and register point is 25 microns, the placement error will be $25 \times \tan 1° \approx 0.4$ microns.

The typical cross-section of microlens 4 is $500 \times 1000$ microns and the focal length is between 60 and 600 microns. The invention is particulary suited to multi-element laser diodes due to the long emission area. It is understood that the invention is not limited to drawn cylindrical lenses but can be used with molded lenses. In this case not only cylindrical but spherical elements can be incorporated.

What is claimed is:

1. A microlens for use in conjunction with a light emitting laser diode die having two exposed surfaces, comprising:
    a first optical surface;
    a second optical surface;
    a plurality of reference edges projecting from said microlens, accurately located relative to said first and second optical surfaces, said microlens positionable with respect to said die such that said reference edges contact the two exposed surfaces of said die so as to locate said optical surfaces accurately relative to a point at which said light is emitted from said die.

2. A microlens as claimed in claim 1 wherein the lens is an aspheric cylindrical lens manufactured by being drawn from a softened glass preform incorporating said optical surfaces and reference edges.

3. A microlens as claimed in claim 1 wherein the focal length of the lens is between 60 microns and 600 microns.

4. A micronlens as claimed in claim 1 wherein the number of reference edges equals to three.

* * * * *